United States Patent
Gallardo Amaya et al.

(10) Patent No.: US 11,287,097 B1
(45) Date of Patent: Mar. 29, 2022

(54) SNAP FIT SELF-LOCATING FASTENER

(71) Applicant: Valeo North America, Inc., Auburn Hills, MI (US)

(72) Inventors: Amando Aurellio Gallardo Amaya, Auburn Hills, MI (US); Roberto Rodriguez, Auburn Hills, MI (US)

(73) Assignee: Valeo North America, Inc., Troy, MI (US)

( * ) Notice: Subject to any disclaimer, the term of this patent is extended or adjusted under 35 U.S.C. 154(b) by 0 days.

(21) Appl. No.: 17/123,212

(22) Filed: Dec. 16, 2020

(51) Int. Cl.
*F21S 41/19* (2018.01)
*H01R 12/70* (2011.01)
*F21V 19/00* (2006.01)

(52) U.S. Cl.
CPC .......... *F21S 41/198* (2018.01); *F21S 41/192* (2018.01); *F21V 19/004* (2013.01); *H01R 12/7029* (2013.01); *H05K 2201/10606* (2013.01)

(58) Field of Classification Search
CPC .. H01R 12/7029; F21S 41/198; F21V 19/004; F21V 19/00
See application file for complete search history.

(56) References Cited

U.S. PATENT DOCUMENTS

| | | | |
|---|---|---|---|
| 5,577,779 A | 11/1996 | Dangel | |
| 6,216,986 B1 * | 4/2001 | Kwilosz | F16L 3/13 248/73 |
| 6,309,085 B1 | 10/2001 | Katz et al. | |
| 6,435,017 B1 | 8/2002 | Nowicki, Jr. et al. | |
| 6,606,808 B2 | 8/2003 | Katz | |
| 6,935,518 B2 | 8/2005 | Winig et al. | |
| 7,318,571 B2 * | 1/2008 | Linssen | F21V 19/00 248/222.12 |
| 7,848,116 B2 | 12/2010 | Duppong et al. | |

FOREIGN PATENT DOCUMENTS

EP 0894201 B1 12/2001

OTHER PUBLICATIONS

Headlight Test abnd Rating Protocol (Version III), 14 pages, dated Jul. 2018.
How to make something that makes almost anything—2012 by Yoav Sterman, 4 pages, accessed Dec. 2, 2020.
Sketches/Design work—Rick Keyton Designs, 1 page, dated Jun. 2015, accessed Dec. 2, 2020.

* cited by examiner

*Primary Examiner* — Robert J May
(74) *Attorney, Agent, or Firm* — Young Basile Hanlon & MacFarlane, P.C.

(57) ABSTRACT

A fastener comprising: a fastener body comprising: a connection body that is movable within the fastener body between a locked position and a locking position to connect to assembly parts together and an alignment tab that is separate from and movable relative to the connection body and is movable within the fastener body and is configured to bias the fastener against one or more of the assembly parts so that the fastener is configured to self-align itself relative to the assembly parts, configured to align the assembly parts relative to one another, or both.

20 Claims, 7 Drawing Sheets

SNAP FIT SELF-LOCATING FASTENER

FIELD

The present teachings relate to a fastener that self-locates within a hole to adjust for variable sized holes and specifically for holes within components of an automotive light.

BACKGROUND

Construction of assemblies typically require multiple parts be connected together. Most parts have some variation from part to part and this variation is acceptable and the parts will connect together and the assembly will work as desired. Typically, with vehicle light assemblies, the parts are connected together and then the parts are aligned so that all of the parts are in a predetermined location relative to one another so that light is projected in a specified direction.

Examples of some connectors may be disclosed in U.S. Pat. Nos. 5,577,779 and 6,435,017 and European Patent No. EP0894201 all of which are expressly incorporated herein by reference for all purposes. Thus, there is a need for a connector that self-aligns when the connector is inserted into an aperture. There is a need for a connector that orients the connector body and associated parts without a post installation alignment. It would be desirable to have connector that self-adjusts to accommodate different sized apertures. There is a need for a connector that snaps in place and adjusts without any external interaction. There is a need for a single body connector that aligns and locks the connector in place simultaneously.

SUMMARY

The present teachings provide: a fastener comprising: a fastener body comprising: a connection body that is movable within the fastener body between a locked position and a locking position to connect to assembly parts together and an alignment tab that is separate from and movable relative to the connection body and is movable within the fastener body and is configured to bias the fastener against one or more of the assembly parts so that the fastener is configured to self-align itself relative to the assembly parts, configured to align the assembly parts relative to one another, or both The present teachings provide: a fastener assembly part comprising a plurality of the fasteners of taught herein the plurality of fasteners extending from the fastener assembly part and are configured to connect the fastener assembly part to another one of the assembly parts.

The present teachings provide a vehicle assembly part comprising a plurality of fasteners taught herein to connect the vehicle assembly part to another vehicle assembly part.

The present teachings provide a light system comprising the fastener, the fastener assembly part, a vehicle fastener assembly part, or a combination thereof.

The present teachings provide a connector that self-aligns when the connector is inserted into an aperture. The present teachings provide a connector that orients the connector body and associated parts without a post installation alignment. The present teachings provide connector that self-adjusts to accommodate different sized apertures. The present teachings provide a connector that snaps in place and adjusts without any external interaction. The present teachings provide a single body connector that aligns and locks the connector in place simultaneously.

DETAILED DESCRIPTION

Figure 1:
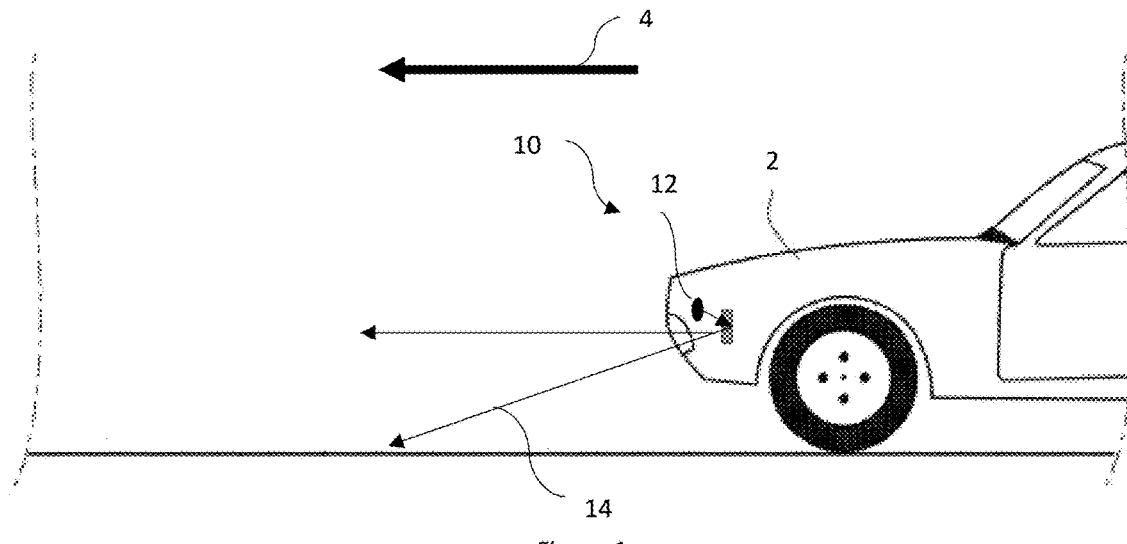
FIG. 1 is a top view of a vehicle including a light system with fasteners.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

The present teachings relate to a light system. The light system is located with a vehicle. Preferably, the light system is part of a car, motorcycle, bus, truck, semi-truck, SUV, XUV, four-wheeler, dirt bike, boat, commercial vehicle, construction vehicle, farm equipment, plane, helicopter, or a combination thereof. The light system may project in a forward direction, rear direction, side direction, a direction of motion, or a combination thereof. Preferably, the light system projects a light from an external surface of the vehicle to a location in front of the vehicle or in a direction of motion of the vehicle (e.g., in front of the vehicle or behind the vehicle). The light system may be integrated into a front end, a rear end, or both of a car. The light system may project light out of the vehicle. The light source may include lights and optical elements, reflectors, lenses, or a combination thereof. The lights of the light system may be created by one or more light sources.

The light of the light system may be created by one or more light sources. The light may extend away from the light sources and illuminate a region. The light system may include one or more light sources, two or more light sources, three or more light sources, four or more light sources, ten or less light sources, or six or less light sources. The one or more light sources function to produce light that illuminates a region. The light sources may be a device or plurality of devices that create light and the light extends outward from the light source and preferably away from a vehicle. The light source may produce a high beam, a low beam, or both. The light source may be aimed to project light in near field or far field. The light source may be any type of lighting device or light that produces light such as an incandescent bulb, fluorescent light, compact fluorescent lamp, halogen lamp, light emitting diode (LED), high intensity discharge lamps (HID); halogen lights, xenon lights, or a combination thereof. The light source may be a single lamp or bulb. Preferably, the light source includes a plurality of lamps, bulbs, diodes, or a combination thereof. The light source may be an array. The light source may include two or more, 5 or more, 10 or more, 20 or more, or even 50 or more devices that produce light and combine together to form the light source. Each light source may include 500 or less, 300 or less, or 200 or less devices that produce light. For example, if the light source is a 10×10 array of light devices some of the 100 devices may be selectively turned on and off, dimmed, brightened, or a combination thereof to create patterns, images, words, text, numbers, shapes, or a combination thereof. The light source may be a single light. The light source may be a plurality of lights.

The light source may be static. The light source may be free of movement. The light source may be fixed. The light source may be fixed and the light from the light source may be moved, bent, directed, or a combination thereof by optical elements, lenses, reflectors, or a combination thereof. The light from the light source may be moved or aimed from near field to far field or vice versa. Each device of the light source may be turned on an off. The color, intensity, shape, or a combination thereof of each device of the light source may be controlled or adjusted. The light source may direct light to a driving surface. For example, a center of the light may be located on the driving surface. The light source may be indirectly directed to a driving surface. For example, the light source may be directed to a reflector and the reflector redirects the light in a direction of motion. The light source may direct light above a driving surface (e.g., some light may contact and illuminate the driving surface by a center of the light may be located above the driving surface). The light source may be directed substantially parallel to the light surface. For example, a center of the light, an axis of the light, or both may extend parallel to the driving surface. The light source may extend along an axis or may be directed away from the axis. If there are a plurality of light sources each light source may be associated with one collimator or reflector. Each collimator or reflector may direct the light outward to a predetermined location in a predetermined location. If there are a plurality of collimators or reflectors, then each may have an associated light source. The light source may be part of or connected to one or more assembly parts.

The assembly parts function to be all or a portion of a light system (e.g., a light system of a vehicle). The assembly parts may be a portion of the light system or a portion of a component that is installed within a light system. The assembly parts may connect to other assembly parts. The assembly parts may snap together, lock together, be connected by a fastener, a screw, a nut, a bolt, a threaded member, a Christmas tree, or a combination thereof. The assembly parts may snap fit together and self-align when the fastener extends through an aperture. The assembly parts may be made of or include metal, plastic, ceramic, a natural material, a synthetic material, polycarbonate, a metallized material, silver, aluminum, or a combination thereof. The assembly parts may be a housing, a printed circuit board, a board that includes one or more diodes, a board that includes or provides power, a board that includes a transformer, a board that includes resistors, or a combination thereof. The assembly parts may include or provide power or signals. The assembly parts may be free of power. The assembly parts may support another assembly part. One assembly part may be the connecting assembly part and one part may be a fastener assembly part.

The fastener assembly parts function to connect to another assembly part. The fastener assembly part may be a female part or a male part. Preferably, the fastener assembly part includes a fastener that extends into and connects two or more assembly parts together. The fastener assembly part, preferably is a male part or includes some male features. The fastener assembly parts may include a plurality of fasteners. The fastener assembly part may be an assembly part that includes one or more fasters or an assembly connector.

The assembly connector functions to connect two assembly parts together by a portion of the assembly connector connecting to an adjacent assembly part. The assembly connector may be a portion of the fastener assembly part that includes fasteners. The assembly connector may be an integral part (e.g., monolithic) part of a fastener assembly part. For example, the assembly part and the assembly connector may be molded simultaneously. The assembly connector may orient all of the fasteners so that when the assembly part is installed the fasteners face in a predetermined direction and form a connection with one or more other assembly parts. The assembly connector may be any portion of the assembly part that includes a fastener. The assembly part may assist the fastener in forming a connection with another assembly part or extending into a mating housing (e.g., an aperture).

The mating housing functions to assist two or more assembly parts in connecting. The mating housing may guide a fastener into an aperture of an assembly part. The mating housing may support an assembly part on the assembly connector. The mating housing may create resistance that prevents the connection of the fastener from being undone. For example, the mating housing may have a height that wedges a portion of the assembly part between the mating housing and the bias lock so that the bias lock is prevented from retracting and releasing the assembly part. The assembly part may include one mating housing at each aperture. The mating housing may include an aperture that aligns with an aperture of an assembly part. The mating housing may be hollow. The mating housing may have a shape that is geometric, square, round, rectangular, circular, oval, ovoid, a trapezoid, or a combination thereof. The mating housing may include one or more through holes (e.g., apertures). The assembly part may include apertures that are free of mating housings. The assembly part may be entirely free of mating housings (e.g., may include zero mating housings). The mating housing may be part of an assembly part or a separate part added between two assembly parts (e.g., a printed circuit board and fastener assembly part).

A printed circuit board (PCB) may function to connect within a light system, control all or a portion of the light system, support lights, support controllers, or a combination thereof. The printed circuit board may provide power or signals to one or more electrical components within the light system. The printed circuit board may support controllers, microprocessors, lights, diodes, light sources, electrical paths, resistors, or a combination thereof. The printed circuit board may be a singled sided PCB, a double sided PCB, a multilayer PCB, a rigid PCB, flexible PCB, a surface mounted PCB, through hole PCB, or a combination thereof. The PCB may be located behind other assembly parts, obscured from view, form a basis to support or align components within the light system, or a combination thereof. The printed circuit board, assembly parts, or both may include one or more apertures.

The apertures function to connect two assembly parts together, to receive one or more fasteners, or both. The apertures may all be substantially uniform relative to one another. The apertures may include variations from aperture to aperture. The apertures may be a through hole.

The apertures may extend from a first surface to a second surface of the assembly part. The apertures may be rigid so that when a fastener extends therethrough the connection with the fastener retains the assembly part in place. The apertures may larger than a fastener when the fastener is in the locking position. The apertures may be smaller than a fastener when the fastener is in the locked position. The fasteners may extend through the aperture in a first direction and be prevented from extending through the aperture in a second direction.

The fasteners function to connect two assembly parts together. The fasteners function to extend from an assembly part (e.g., a fastener assembly part) into another assembly part. The fasteners may project from an assembly part. All or a portion of the fastener may extend within a plane. The fasteners may be movable between a locked position and a locking position. In the locking position, all of the fastener may be substantially located within a plane. In a locked position a portion of the fastener (e.g., bias lock) may extend out of the plane. The fastener may include a fastener body, alignment tab, projection, tab recess, tab connector, tab ears, tab clearance, connection body, bias lock, or a combination thereof.

The fastener body functions to form a plane of the fastener, form a majority of the fastener, include an alignment tab and connection body, or a combination thereof. The fastener body may form a peripheral edge and a central portion of the fastener. The fastener body may be a portion of the fastener that connects to and projects out from the assembly part. The fastener body may include recesses that separate an outer portion from the connection body, the alignment tab, or both. The fastener body may have a generally "U" shaped portion that connects the fastener to an assembly part. The fastener body may include an alignment tab, a connection body, or both within a center. The fastener body may include an outer portion and an inner portion. A peripheral portion of the fastener body may extend around an alignment tab, a connection body, or both of the fastener.

The alignment tab may function to position the fastener within an aperture. The alignment tab may be movable. The alignment tab may be movable relative to the peripheral portion (e.g., outer portion) of the fastener body, the bias lock, the connection body, or a combination thereof. The alignment tab is separate from the outer portion of the fastener body. The alignment tab may move the fastener relative to a wall of the assembly part so that the fastener is aligned within an aperture. The alignment tab may function to self-align the fastener within an aperture or relative to another assembly part. The alignment tab may extend cantilever from an assembly part, a base of the fastener body, or both. The alignment tab may move the fastener in a first direction, a second direction, or both. The alignment tab may move so that the fastener remains in a plane that extends through an aperture. The alignment tab may extend at an angle relative to a wall of the aperture, at an angle relative to a plane of the assembly part, or both. The alignment tab may extend within a body plane of the fastener body when the alignment tab is in an unbiased state. The alignment tab may extend the fastener at an angle of about 85 degrees or more, about 87 degrees or more, or about 90 degrees relative to the assembly part it is connected (e.g., a plane of the assembly part). The alignment tab may extend the fastener at an angle of about 95 degrees or less, about 93 degrees or less, or about 91 degrees or less relative to the assembly part it is connected. The alignment tab may move the fastener body, the connection body, a plane of the fastener body, or a combination thereof an angle of about 1 degree or more, about 2 degrees or more, or about 3 degrees or more. The alignment tab may move the fastener body, the connection body, a plane of the fastener body, or a combination thereof an angle of about 15 degrees or less, about 10 degrees or less, or about 5 degrees or less. The alignment tab in a resting position (e.g., not being biased) may extend within a plane of the fastener body. The alignment tab may move out of the plane of the fastener body when the alignment tab is biasing the fastener. The alignment tab may elastically deform when inserted into an aperture to align the fastener within the aperture, relative to another assembly part, or both. The alignment tab may include one or more projections that assist in biasing the alignment tab.

The projections function to bias the alignment tab, align the fastener within an aperture, move the alignment tab so that the fastener extends within a plane or is aligned to connect assembly parts together. The projections may bias the alignment tab when the alignment tab is biased out of the body plane. The alignment tab when biased out of the plane by the projections may align the connection body within the plane. The projections may be located near an edge of the alignment tab, at a top half of an alignment tab, a top quarter of an alignment tab, in corners, in tab ears, or a combination thereof. The projections may extend out of the fastener body plane. The alignment tab may extend within a body plane of the fastener and the projections may extend out of the body plane when the fastener is in an unbiased or a neutral state. The alignment tab may include one or more, two or more, three or more, or four or more projections. Preferably, the alignment tab includes two projections. The projections may have a shape that is circular, domed, square, rectangular, triangular, pyramidal, a cuboid, a have sphere, a cube, a cylinder, a hexagonal prism, a cone, or a combination thereof. The projections may have an arced surface that allows the projects to slide across a wall of an aperture. The projections may be shaped to slide along a surface as the fastener is inserted into an aperture so that the alignment tab is biased by the projection. The projection may have a height or extend a distance from the alignment tab, the tab ears, or both. A height or a distance of the projections may determine an amount the fastener is biased, the alignment tab is biased, or both. The height or distance of the projection may be about 0.1 mm or more, about 0.5 mm or more, about 0.75 mm or more, about 1 mm or more, or about 1.5 mm or more. The projection may be about 10 cm or less, about 7 mm or less, about 5 mm or less, about 3 mm or less, or about 2 mm or less. The projection may have a cross-sectional length of about 0.1 mm or more, about 0.5 mm or more, about 0.75 mm or more, about 1 mm or more, or about 1.5 mm or more. The projections may have a cross-sectional length of about 10 cm or less, about 7 mm or less, about 5 mm or less, about 3 mm or less, or about 2 mm or less. The projections may be symmetrically located on an alignment tab. The projections may be asymmetrically located on an alignment tab. The projections may be located in two corners. The projections may be two opposing projections. The projections may be located in opposing corners along a top of the alignment tab. The projections may be located on tab ears.

The tab ears function to support projections and move the projections into contact with a wall so that the projections and alignment tab bias the fastener within an aperture. The tab ears may be located at an end of the alignment tab so that the alignment tab creates a force against a wall of the aperture. The tab ears may extend the projections above a main body of the alignment tab, to a side of a main body of the alignment tab, or both. For example, the tab ears may extend above a main body portion. In another example, the tab ears extend to a side relative to a main body portion of the alignment tab. The ears may have a "C" shape, a "U" shape, a bulbous portion that extends outward, or a combination thereof from the alignment tab. The alignment tab may include two tab ears that extend upward and outward. The tab ears may project outward from the alignment tab. The tab ears may extend outward towards an edge of the connector or the fastener body. The tab ears may be spaced apart by a tab clearance. The tab ears may extend the projections to a location proximate to the bias lock, substantially in line with an end or tip of the bias lock, or a combination thereof. The bias lock may be formed by a curved tab recess.

The tab recesses function to separate an inner portion from an outer portion of the fastener body, allow the alignment tab, the connection body, or both to move within the fastener body. The tab recess may separate the alignment tab from the outer portion of the fastener body. The tab recesses may extend along a first side, a second side, an upper portion, or a combination thereof of the alignment tab. The tab recesses may be one continuous piece. The tab recesses may be one or more segments, two or more segments, or three or more segments, or five or less segments. The tab recesses may be segments that interconnect together. The tab recesses may separate the alignment tab from the fastener body (e.g., an outer portion of the fastener body). The tab recesses may extend along two or more sides of the alignment tab. The tab recesses may be linear, curved, have straight portions and curved portions, have a length that is substantially a same as the alignment tab. The tab recesses may extend along opposing sides of the alignment tab. The tab recesses may be reverse mirror images of one another. The tab recesses may have a concave shape, a convex shape, or both relative to an edge of the fastener body. The tab recesses may be an absence of material. The tab recesses may be removed material, material that is not formed, or both. The tab recesses may define a shape of the alignment tab. The tab recesses may terminate at a tab connector.

A tab connector functions to connect an inner portion of the fastener (e.g., an alignment tab) to an outer portion of the fastener. The tab connector may be a portion of the fastener that is free of a tab recess or a tab clearance. The tab connector may be located at a base of the alignment tab. The tab connector may be a portion of the fastener body that connects an inner portion to an outer portion. The tab connector may plastically deform. The tab connector may elastically deform. The tab connector may be located between two "U" shaped portions or at an end of the "U" shape portions. The alignment tab may form a cantilever connection at the tab connector. The tab connector may be located below an aperture when the fastener is inserted into an aperture. The tab connector may be located between two tab recesses. The tab connector may be monolithically formed with an outer portion of the fastener body. The tab connector may be located at a base of the connector. The tab connector may be located a farthest distance from the tab ears, the projections, or both and still be part of the alignment tab. The tab connector may be a spaced that is located between ends of the tab recesses. The tab connector may be located opposite tab clearances.

The tab clearances function to create a space between two inner portions of the fastener body, create a space between a connection body and an alignment tab, or both. The tab clearance may allow a bias lock to move without the bias lock contacting the alignment tab. The tab clearance may be sufficiently large so that the connection body and the alignment tab are movable relative to one another without contacting one another. The tab clearance may have a varying width. The tab clearance may have a width at one or more locations of about 0.1 mm or more, about 0.3 mm or more, about 0.5 mm or more, about 0.7 mm or more, about 1 cm or more, or about 1.5 cm or more, The tab clearance may have a width at one or more locations of about 5 cm or less, about 4 cm or less, about 3 cm or less, or about 2 cm or less. The tab clearance may have a width at one location of about 1 cm at one location and about 2 cm at another location. The tab clearance may connect two tab recesses together. The tab clearance may be a widening of the tab recesses. The tab recesses may extend into and connect together within the tab clearance. The tab clearance may be "U" shaped, concave, convex, a concave portion of the alignment tab, a convex portion of the alignment tab, or a combination thereof. The tab clearance may span about 50% or more, about 60% or more, about 70% or more, or about 80% or more a width of the fastener. The tab clearance may span about 95% or less, or about 90% or less a width of the fastener. The tab clearance may assist in allowing the alignment tab to bias the fastener and connection body in a bias direction.

The bias direction functions to be a direction that the alignment tab biases the fastener relative to an aperture or within an aperture. The bias direction caused by the alignment tab may be a direction opposite the direction that the projections extend outward. The bias direction may center the fastener within an aperture, move a portion of the fastener into contact with a wall of the aperture, or both. The bias direction may align the connection body with an aperture. The bias direction may extend the connection body, the bis lock, or both out of an aperture, to be aligned with an aperture, or both. The bias direction may extend the bias lock over a body portion of an assembly part including the aperture. The bias direction of the alignment tab may be towards a bias lock of a connection body.

The connection body functions to connect the fastener to an assembly part. The connection body may extend partially or fully through an assembly part or an aperture in an assembly part. The connection body may entirely extend out of an aperture of an assembly part. The connection body may move relative to the alignment tab, the fastener body, or both. The connection body may be spaced apart from an outer portion of the fastener body by a tab recess. The connection body, preferably moves relative to an outer portion of the fastener body. The connection body is movable between a locked position and a locking position to connect two or more assembly parts together. The connection body may have a tab recess on each side. The connection body may have a cantilever connection. The connection body may be plastically deformable, elastically deformable, or both. The connection body may have a width that is less than a width of the alignment tab. The width of the alignment tab may be about 1× or more, about 2× or more, about 3× or more, or about 4× or more a width of the connection body. The connection body may extend through an aperture and then connect the fastener to an assembly part via a bias lock.

The bias lock functions to connect the fastener, a fastener assembly part, or both to an assembly part. The bias lock may move between a locked position and a locking position. In the locked position, the bias lock may extend outward out of a plane of the fastener body. The bias lock, in the locking position, may be biased so that the bias lock is at least temporarily located within a plane of the fastener body. The bias lock may be ramp shaped. The bias lock may be a one way lock. The bias lock may be compressed when the bias lock is moved in a first direction. The bias lock may be free of compression when the bias lock is moved in a second direction. The bias lock may contact a portion of the assembly part proximate to an aperture so that the fastener is prevented from being removed from the aperture. The bias lock may snap lock the fastener to an assembly part, an aperture, or both. The bias lock may snap in place once the bias lock extends through the aperture. The bias lock may snap lock while the alignment tab aligns the fastener within the aperture to snap fit the fastener to the assembly part. The bias lock may elastically snap back into place once the bias lock passed through the aperture.

FIG. 1 illustrates a vehicle 2 moving in a direction 4. The vehicle 2 includes a light system 10 including a light source 12 that directs light 14 in the direction of motion 4 of the vehicle 2.

Figure 2:
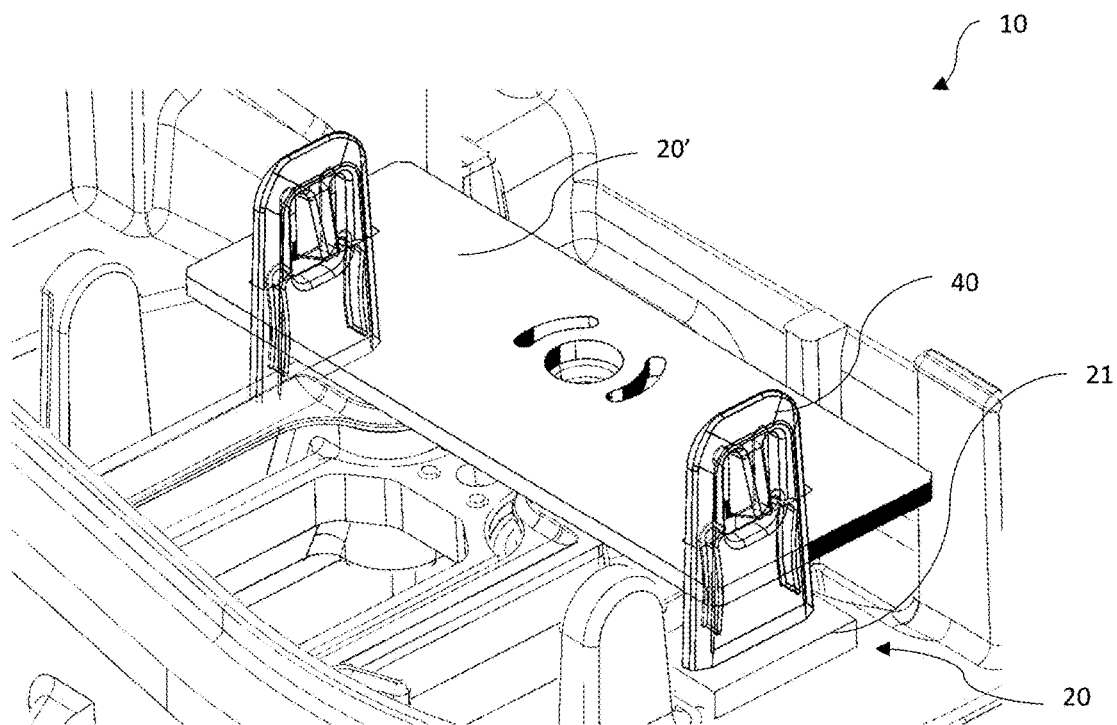
FIG. 2 is a perspective view of a light system including fasteners.

FIG. 2 illustrates a light system 10. The light system includes an assembly part 20 connected to another assembly part 20'. The assembly part 20 is a fastener assembly part 21 including fasteners 40 extending therefrom to receive the another assembly part 20'.

Figure 3:
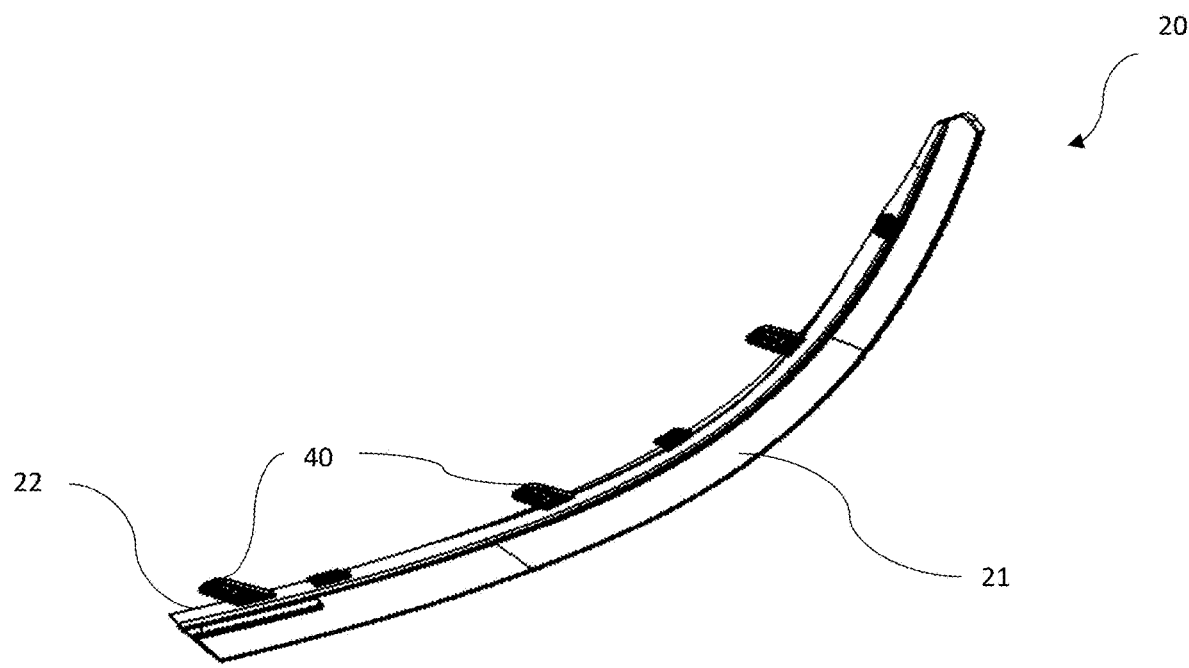
FIG. 3 is a perspective view of a vehicle part including a plurality of fasteners.

FIG. 3 is an assembly part 20 that as shown is a fastener assembly part 21 having an assembly connector 22 with a plurality of fasteners 40 for connecting the assembly part 20 to another component or assembly part (not shown).

Figure 4:
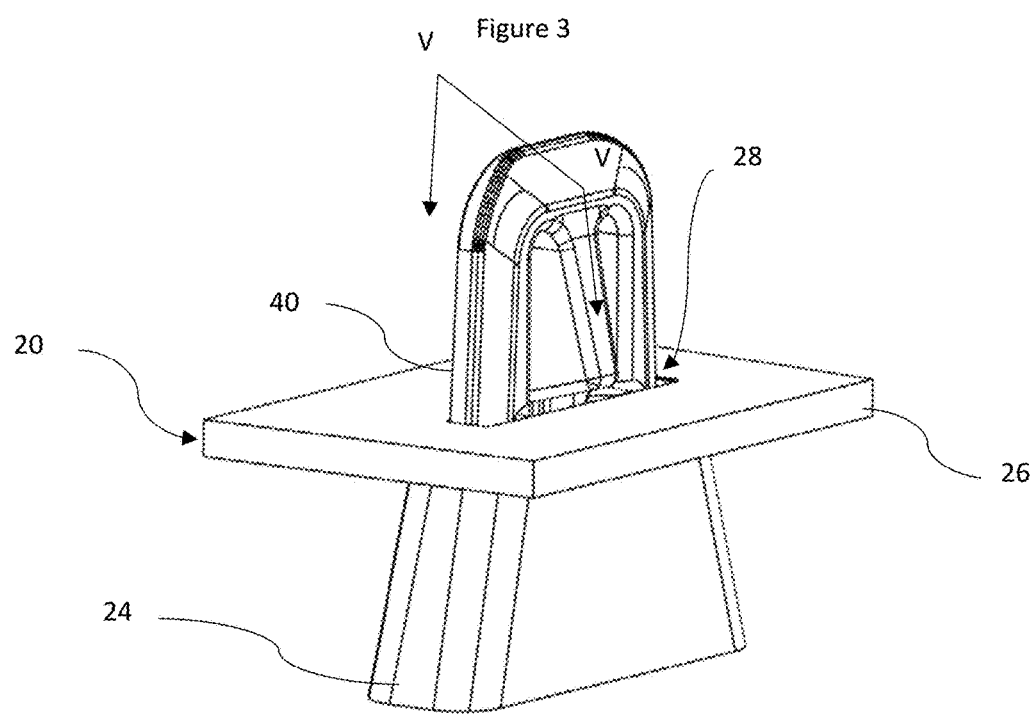
FIG. 4 is a perspective close-up cut away view of a fastener connected to a part.

FIG. 4 is a fastener 40 extending through an assembly part 20. The assembly part includes 20 includes a mating housing 24 and an aperture 28 for receiving the fastener 40. The assembly part 20 as shown is a printed circuit board 26.

Figure 5:
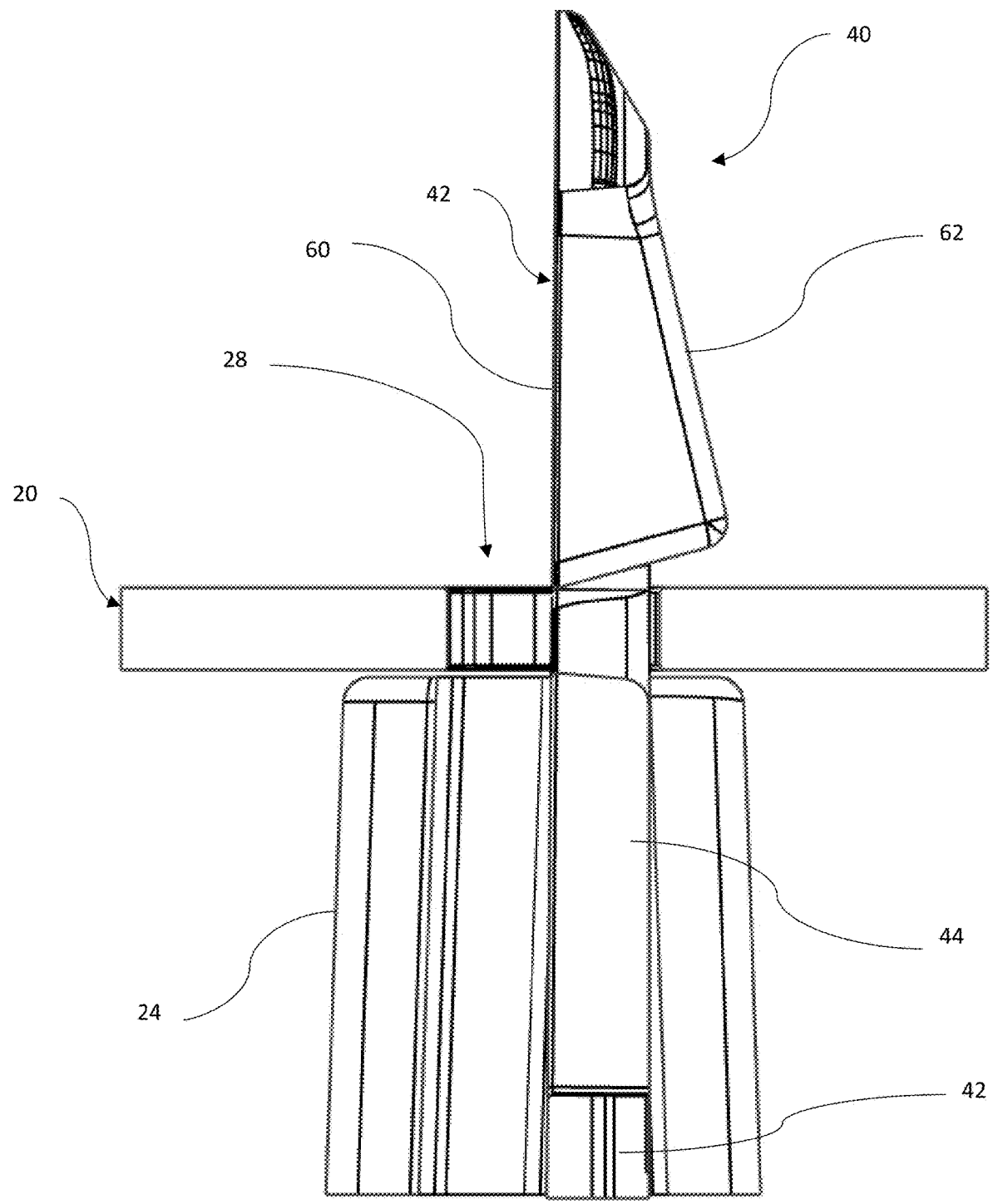
FIG. 5 is a cross-sectional view of the fastener of FIG. 4.

FIG. 5 is a cross-sectional view of the assembly part 20 and the fastener 40 in a connected state along lines V-V. The assembly part 20 includes a mating housing 24 with an aperture 28 extending therethrough. The fastener 40 extends through the aperture 28 and includes a portion of the fastener body 42 on a first side of the assembly part 20 and a portion of the fastener body 42 on a second side of the assembly part 20. An alignment tab 44 extends into the aperture 28 and biases against a wall of the aperture 28 to bias the fastener 40 relative to the assembly part 20. A second side of the fastener body 42 includes a connection body 60 having a bias lock 62 that biases as the connection body extends through the aperture 28 and then expands to prevent the fastener 40 from being removed from the aperture 28.

Figure 6:
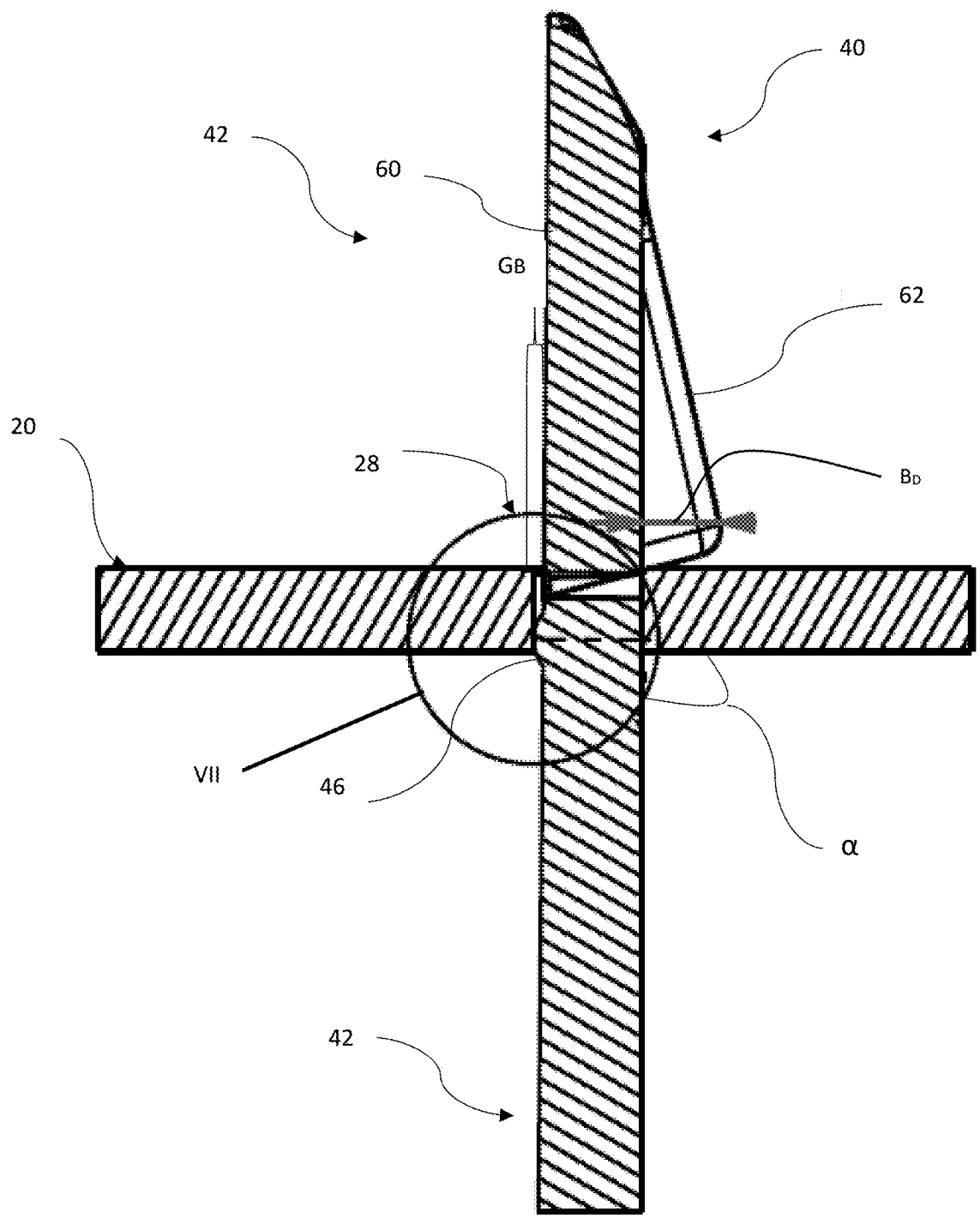
FIG. 6 is a cross-sectional view of a fastener inserted into a part.

FIG. 6 is a cross-sectional view of the assembly part 20 and the fastener 40 extending through the aperture 28. The fastener 40 included a portion of a fastener body 42 above the assembly part 20 and below the assembly part 20. The fastener body 42 has a projection 46 that extends outward to bias the fastener 40 against a wall of the aperture 28 as the fastener 40 is inserted into the aperture 28 so that an angle ($\alpha$) is created between the fastener 40 and the assembly part 20. The projection 46 biases the fastener 40 a distance to form a gap ($G_B$) on a side of the fastener 20 proximate to the projection 46. The fastener 60 includes a bias lock 62 that extends outward a distance ($B_D$) to lock the fastener 40 within the assembly part 20.

Figure 7:
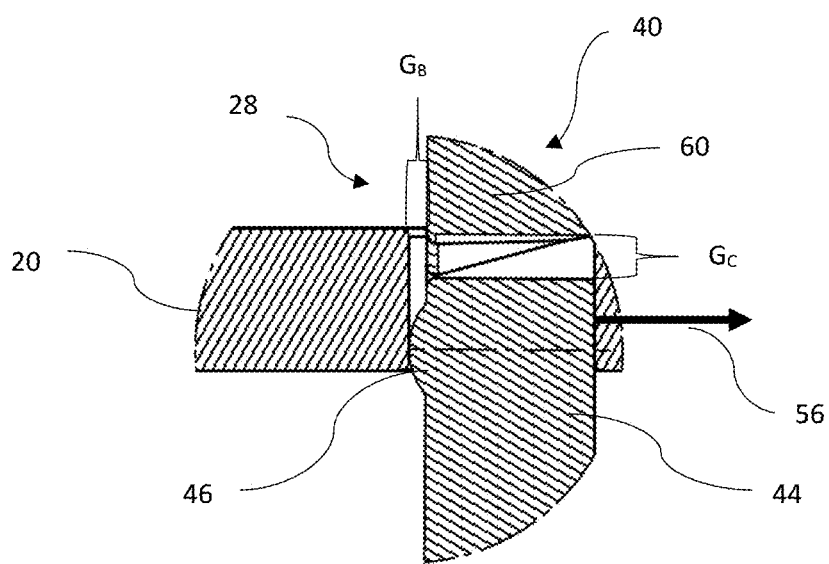
FIG. 7 is a close-up view of the fastener connection and part of FIG. 6.

FIG. 7 is a close-up plan view of a fastener 40 extending into and contacting an aperture 28 of an assembly part 20. The fastener 40 includes an alignment tab 44 with a projection 46 that contacts a wall of the aperture 28. The projection 46 biases the alignment tab 44 in the direction 56, a distance, so that a gap ($G_B$) is formed above the projection 46. The alignment tab 44 is spaced apart from a connection body 60 by a gap ($G_C$) so that the alignment tab 44 is free to move relative to the connection body 60.

Figure 8:
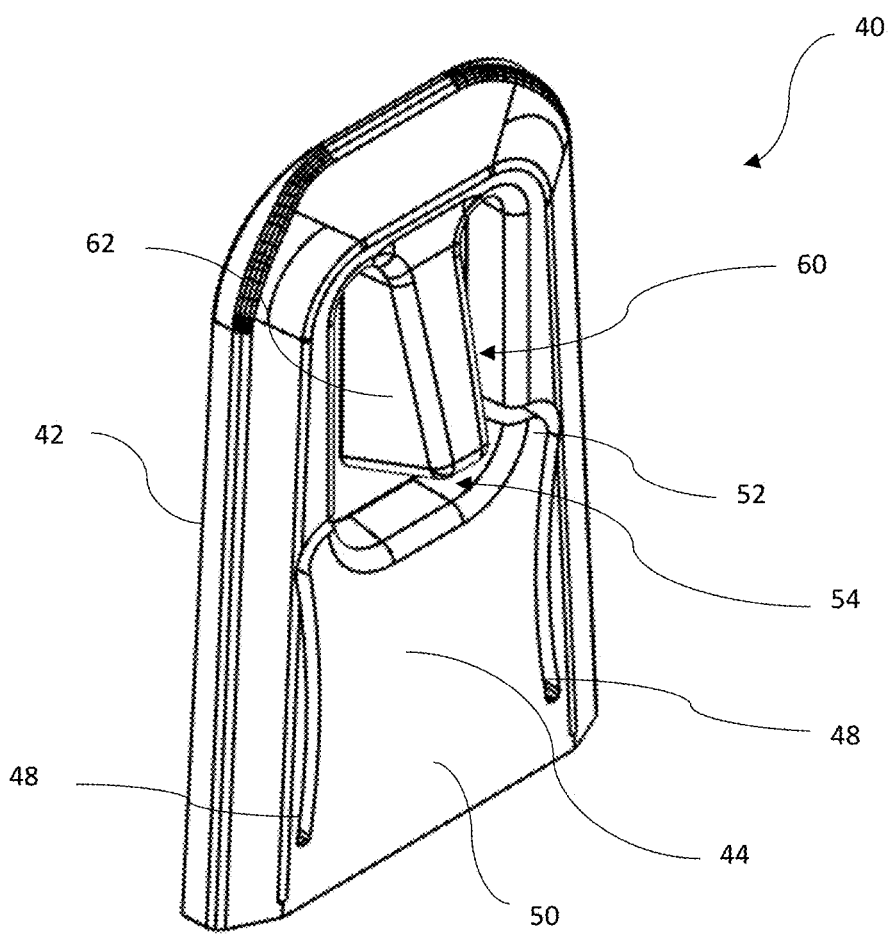
FIG. 8 is a perspective view of a fastener.

FIG. 8 is a perspective view of a fastener 40. The fastener 40 includes a fastener body 42 that is divided into an alignment tab 44 and connection body 60. The alignment tab 44 is formed by tab recesses 48 extending around the alignment tab 44. The tab recesses 48 terminate at a bottom of the fastener 40 so that a tab connector 50 is formed that connects the alignment tab 44 to a base of the fastener body 42. The alignment tab 44 includes tab ears 52 that are located on opposing sides/edges of the alignment tab 44. The alignment tab 44 is spaced apart from the connection body by a tab clearance 54 so that the alignment tab 44 and the connection body 60 are movable relative to one another. The connection body 60 includes a bias lock 62 that is movable between a locked position and a locking position so that the connection body 60 is extendable through an aperture (not shown) to form a connection.

Figure 9A:
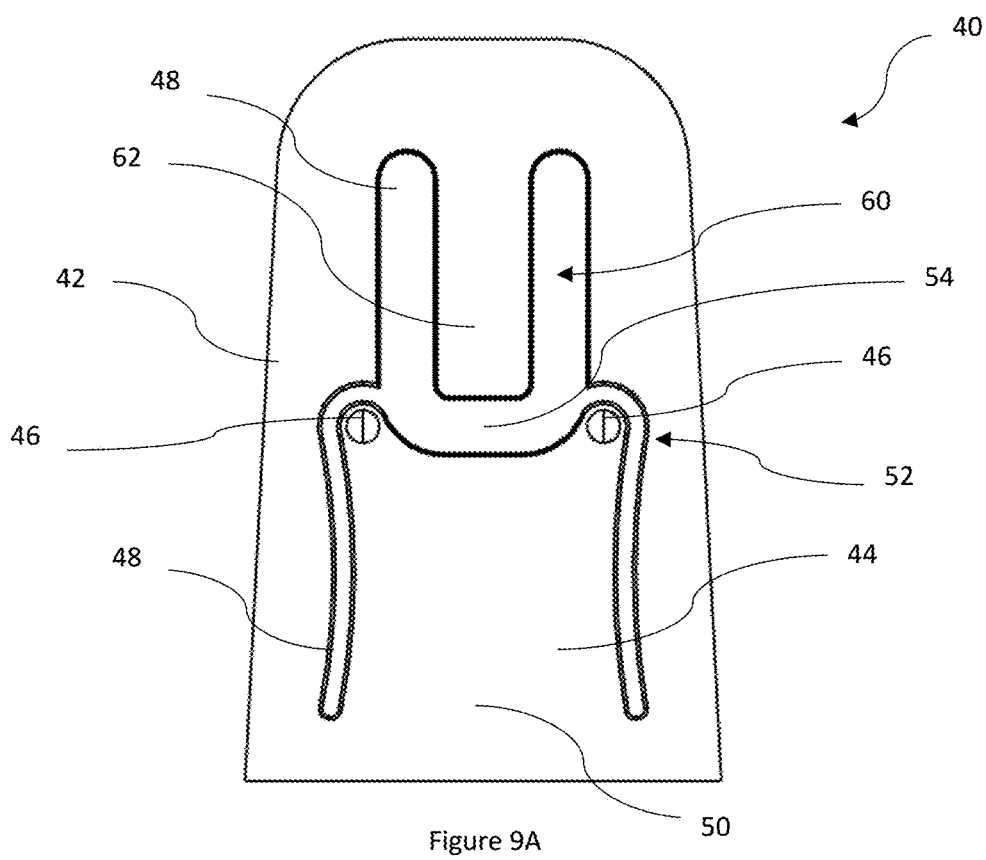
FIG. 9A is a rear plan view of a fastener.

FIG. 9A is a plan view of a rear side of a fastener 40. The fastener 42 includes a fastener body 42 forming a peripheral edge and including a fastener body 42 and a connection body 60 connected to and extending inside of the peripheral edge. The fastener body 42 includes an alignment tab 44 with a pair of projections 46 extending therefrom. Tab recesses 48 extend around the alignment tab 44 so that the alignment tab 44 is movable and around the connection body 62 so that the connection body 62 is movable. The alignment tab 44 has a cantilever connection with the tab connector 50. The alignment tab 44 has tab ears 52 that project outward from the alignment tab 44, the tab ears 52 including the projections 46. The alignment tab 44 is spaced apart from the connection body 60 by a tab clearance 54 so that as the connection body 60 is biased by the bias lock 62 the connection body 60 and alignment tab 44 are free to move relative to one another.

Figure 9B:
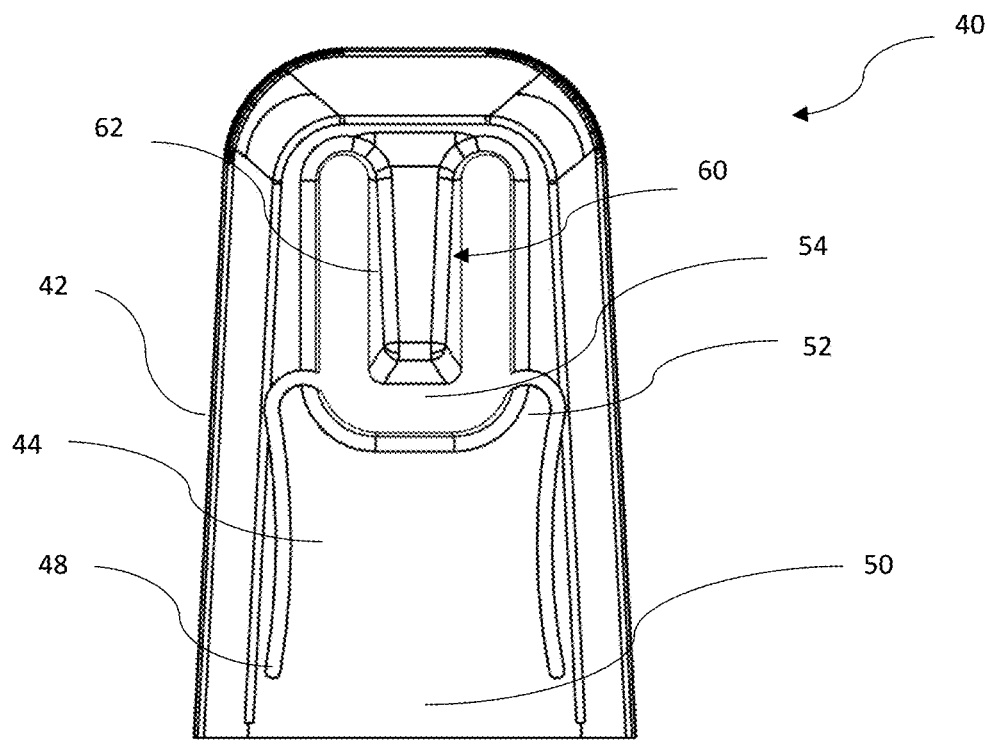
FIG. 9B is a front plan view of a fastener.

FIG. 9B is a plan view of a front side of a fastener 40. The fastener 42 includes a fastener body 42 forming a peripheral edge and including a fastener body 42 and a connection body 60 connected to and extending inside of the peripheral edge. The fastener body 42 includes an alignment tab 44 surrounded on three sides by tab recesses 48 that allow the alignment tab 44 to move. The alignment tab 44 has a cantilever connection with the tab connector 50. The alignment tab 44 has tab ears 52 that project outward from the alignment tab 44. The alignment tab 44 is spaced apart from the connection body 60 by a tab clearance 54 so that as the connection body 60 is biased by the bias lock 62 the connection body 60 and alignment tab 44 are free to move relative to one another.

Figure 10:
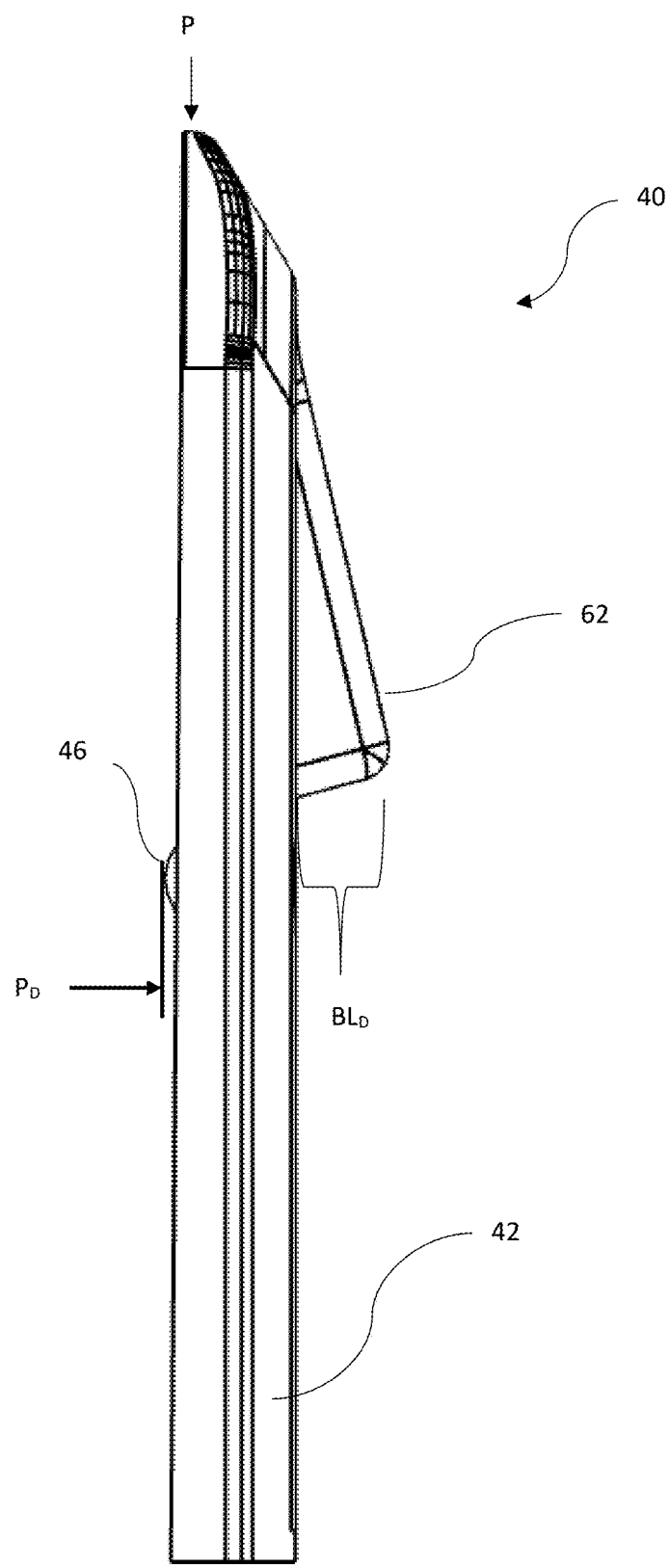
FIG. 10 is a side view of a fastener.

FIG. 10 is a side view of a fastener 40. The fastener 40 includes a fastener body 42 extending in a plane (P). The projection 46 extends outward from the plane (P) a distance ($P_D$). The bias lock 62 in a locked position extends a distance ($BL_D$) from the plane (P) of the fastener body 42.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of or even consists of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

ELEMENT LIST

2 Vehicle
4 Direction of Motion
10 Light System
12 Light Source
14 Light
20 Assembly Part
21 Fastener Assembly part
22 Assembly Connector
24 Mating Housing
26 Printed Circuit Board
28 Aperture
40 Fastener
42 Fastener Body
44 Alignment Tab
46 Projection
48 Tab Recess
50 Tab Connector
52 Tab Ears
54 Tab clearance
56 Bias Direction
60 Connection Body
62 Bias Lock

We claim:

1. A fastener comprising:
a fastener body comprising:
a connection body that is movable within the fastener body between a locked position and a locking position to connect two assembly parts together, wherein the connection body comprises a bias lock that biases to the locked position and prevents the fastener from being removed when connecting the two assembly parts together;
an alignment tab that is separate from and movable relative to the connection body; the alignment tab is movable within the fastener body; and the alignment tab is configured to bias the fastener against one or more of the assembly parts so that the fastener is configured to self-align itself relative to the assembly parts, configured to align the assembly parts relative to one another, or both; and
a tab clearance located directly between and separating the bias lock and the alignment tab.

2. The fastener of claim 1, wherein the assembly parts are part of an automotive vehicle.

3. The fastener of claim 2, wherein the assembly parts are part of a light system of the automotive vehicle.

4. The fastener of claim 3, wherein one of the assembly parts is a printed circuit board of the light system.

5. The fastener of claim 1, wherein the alignment tab includes tab recesses that connect to the tab clearance and extend along two or more sides of the alignment tab and directly separate the alignment tab from the fastener body.

6. The fastener of claim 5, wherein the tab recesses are curved and have a concave shape relative to an edge of the fastener body.

7. The fastener of claim 1, wherein the alignment tab includes a tab connector that forms a connection with the fastener body and the alignment tab extends cantilever from the tab connector.

8. The fastener of claim 1, wherein the alignment tab includes tab ears that project outward from the alignment tab.

9. The fastener of claim 8, wherein the tab ears are spaced apart by the tab clearance extending into the alignment tab between the tab ears.

10. The fastener of claim 8, wherein the tab ears extend in a first direction towards the connection body and in a second direction outward towards the fastener body.

11. The fastener of claim 8, wherein the tab ears are two tab ears and each of the two tab ears include a projection that is configured to bias the alignment tab as the alignment tab is connected to one or more of the assembly parts.

12. The fastener of claim 1, wherein the alignment tab includes one or more projections that extend orthogonally from the alignment tab a distance to bias the alignment tab against the one or more of the assembly parts.

13. The fastener of claim 12, wherein the alignment tab extends within a same plane as the fastener body and the one or more projections extend out of the plane.

14. A fastener assembly part comprising a plurality of the fasteners of claim 1, the plurality of fasteners extending from the fastener assembly part and are configured to connect the fastener assembly part to another one of the assembly parts.

15. The fastener of claim 1, wherein the bias lock extends out of a plane of the fastener body so that when the bias lock extends through an aperture in one of the two assembly parts, a height of the bias lock out of the plane prevents the fastener from being removed from the aperture.

16. A fastener comprising:
a fastener body comprising:
a connection body that is movable within the fastener body between a locked position and a locking position to connect two assembly parts together;
an alignment tab that is separate from and movable relative to the connection body and is movable within the fastener body and is configured to bias the fastener against one or more of the assembly parts so that the fastener is configured to self-align itself relative to the assembly parts, configured to align the assembly parts relative to one another, or both; and
one or more projections that extend from the alignment tab a distance to bias the alignment tab against the one or more of the assembly parts; and
wherein the alignment tab in an unbiased state extends in a plane and the connection body in an unbiased state extends in the plane and the one or more projections bias the alignment tab so that all or a portion of the alignment tab extends out of the plane.

17. The fastener of claim 16, wherein the alignment tab, when biased out of the plane, aligns the connection body within the plane.

18. The fastener of claim 16, wherein the one or more projections are two opposing projections.

19. The fastener of claim 16, wherein the one or more projections are dome shaped.

20. The fastener of claim 16, wherein the one or more projections have a height above the alignment tab and the height of the one or more projections determines an amount the fastener is biased.

* * * * *